United States Patent
Shan et al.

(10) Patent No.: US 11,556,818 B2
(45) Date of Patent: Jan. 17, 2023

(54) DYNAMIC INTELLIGENT TEST METHOD AND COMPUTER DEVICE EMPLOYING THE METHOD

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Jiang-Feng Shan, Zhengzhou (CN); Lei-Tong Yu, Shenzhen (CN); Cun-Wei Zou, Shenzhen (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 437 days.

(21) Appl. No.: 16/920,571

(22) Filed: Jul. 3, 2020

(65) Prior Publication Data

US 2021/0342714 A1    Nov. 4, 2021

(30) Foreign Application Priority Data

Apr. 30, 2020  (CN) .......................... 202010366713.5

(51) Int. Cl.
  *G06N 5/04*   (2006.01)
  *G06N 20/00*  (2019.01)
(52) U.S. Cl.
  CPC .............. *G06N 5/04* (2013.01); *G06N 20/00* (2019.01)

(58) Field of Classification Search
  CPC .................................. G06N 5/04; G06N 20/00
  See application file for complete search history.

(56) References Cited

U.S. PATENT DOCUMENTS

| | | | | |
|---|---|---|---|---|
| 4,152,639 A * | 5/1979 | Chaffee | ............... | G01R 19/145 324/508 |
| 4,357,574 A * | 11/1982 | Takamisawa | ...... | G01R 31/3842 324/426 |
| 6,304,502 B1 * | 10/2001 | Watanabe | .............. | G11C 29/76 365/201 |
| 6,504,395 B1 * | 1/2003 | Johnson | ........... | G01R 31/31721 324/750.02 |
| 6,815,943 B2 * | 11/2004 | Kuno | .................. | G01R 31/2834 324/76.61 |
| 6,954,907 B2 * | 10/2005 | Nakano | ................... | G06F 16/00 716/54 |
| 7,218,980 B1 * | 5/2007 | Orshansky | ........... | G06Q 10/087 700/121 |

(Continued)

OTHER PUBLICATIONS

Liu, 2018, IEEE, sections 1-4.*

*Primary Examiner* — Michael I Ezewoko
(74) *Attorney, Agent, or Firm* — ScienBiziP, P.C.

(57) ABSTRACT

A method for dynamic intelligent testing of a target, to be tested according to projects, includes calling up a data distribution model of a project in response to a target being tested by the project, and obtaining a test range corresponding to the project based on the data distribution model. The method further includes obtaining a test value when the target is at a minimum power consumption value by testing the target based on the test range, and updating the data distribution model and the test range of the project based on the test value.

18 Claims, 3 Drawing Sheets

(56) References Cited

U.S. PATENT DOCUMENTS

| | | | |
|---|---|---|---|
| 7,930,579 B2* | 4/2011 | Yuan | G01R 31/40 |
| | | | 713/340 |
| 9,954,727 B2* | 4/2018 | Su | H04L 41/0686 |
| 10,254,333 B2* | 4/2019 | Kim | G01R 31/2894 |
| 11,113,165 B2* | 9/2021 | Liao | G06F 11/2273 |

* cited by examiner

DYNAMIC INTELLIGENT TEST METHOD AND COMPUTER DEVICE EMPLOYING THE METHOD

CROSS-REFERENCE TO RELATED APPLICATIONS

This application claims priority to Chinese Patent Application No. 202010366713.5 filed on Apr. 30, 2020, the contents of which are incorporated by reference herein.

FIELD

The subject matter herein generally relates to testing technology.

BACKGROUND

During design of new products, keeping the power consumption as low as possible is an important consideration. Projects are added to a testing station for testing a target. Each project requires the target to be tested to run at different frequencies and voltages and currents under different loads to find a minimum power consumption value. The minimum power consumption value when found can be added to a register of the test station. When an operating system is running in different states, the minimum power consumption value can be called to set the current and voltage supply, so as to achieve the purpose of maximizing battery energy saving. However, it takes a long time to obtain the minimum power consumption value, which seriously affects test capacity.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
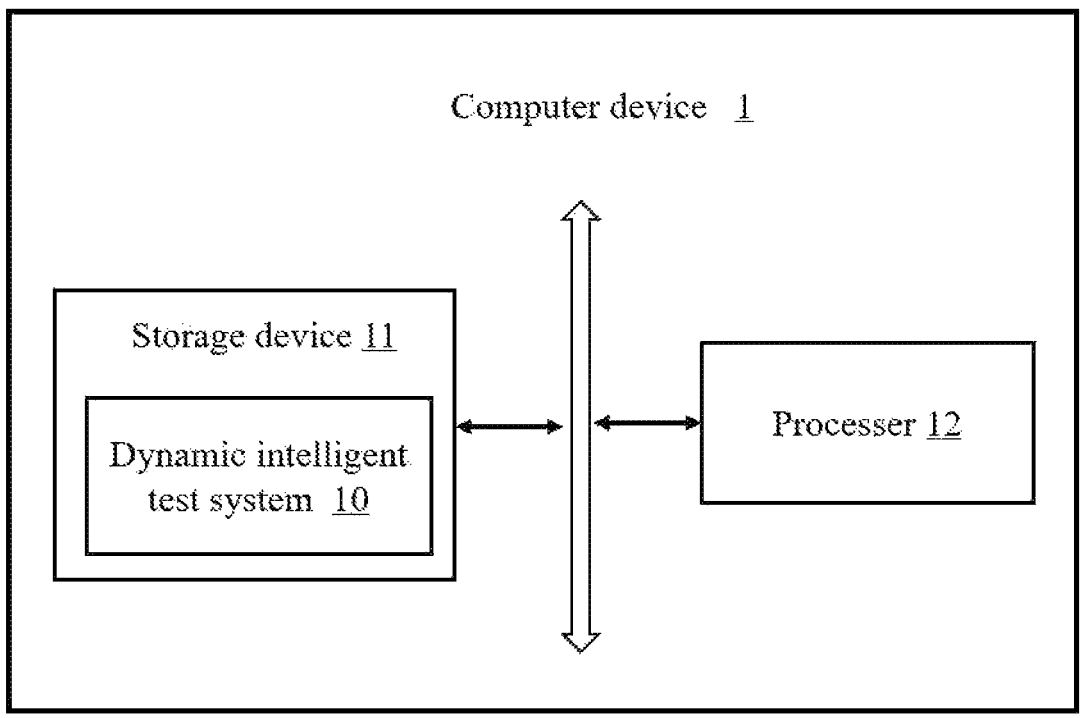
FIG. 1 is a block diagram of one embodiment of a computer device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. It should be noted that references to "an" or "one" embodiment in this disclosure are not necessarily to the same embodiment, and such references mean "at least one."

The term "module", as used herein, refers to logic embodied in hardware or firmware, or to a collection of software instructions, written in a programming language, such as, Java, C, or assembly. One or more software instructions in the modules can be embedded in firmware, such as in an EPROM. The modules described herein can be implemented as either software and/or hardware modules and can be stored in any type of non-transitory computer-readable medium or other storage device. Some non-limiting examples of non-transitory computer-readable media include CDs, DVDs, BLU-RAY™, flash memory, and hard disk drives. The term "comprises" means "including, but not necessarily limited to"; it specifically indicates open-ended inclusion or membership in a so-described combination, group, series, and the like.

FIG. 1 is a block diagram of one embodiment of a computer device (computer device 1). Depending on the embodiment, the computer device 1 can include, but is not limited to, a storage device 11 and at least one processor 12. The storage device 11 and the at least one processor 12 communicate with each other through a system bus.

FIG. 1 illustrates only one example of the computer device 1, other examples can comprise more or fewer components that those shown in the embodiment, or have a different configuration of the various components.

It should be noted that the computer device 1 is only an example, and other existing or future computer devices that may be adapted to the present invention should also be included in the scope of protection of the present invention and are included here by reference.

In at least one embodiment, the storage device 11 may be used to store computer programs and various data of computer programs. For example, the storage device 11 may be used to store a dynamic intelligent test system 10 installed in the computer device 1. The storage device 11 may include Read-Only Memory (ROM), Programmable Read-Only Memory (PROM), Erasable Programmable Read-Only Memory (EPROM), One-time Programmable Read-Only Memory (OTPROM), Electronically Erasable Programmable Read-Only Memory (EEPROM), Compact Disc Read-Only Memory (CD-ROM) or other optical disk storage, magnetic disk storage, magnetic tape storage, or any other non-volatile computer-readable storage medium that can be used to carry or store data.

In some embodiments, the at least one processor 12 may be composed of integrated circuits. For example, it may be composed of a single packaged integrated circuit, or multiple integrated circuits with the same function or different functions, including one or more central processing units, microprocessors, a combination of digital processing chip, graphics processor, and various control chips. The at least one processor 12 is a control unit of the computer device 1, connects various components of the entire computer device 1 with various interfaces and lines, and executes programs or modules stored in the storage device 11 or instruction and calls up the data stored in the storage device 11 to execute various functions and process data of the computer device 1, for example, dynamic intelligent test function.

Figure 3:
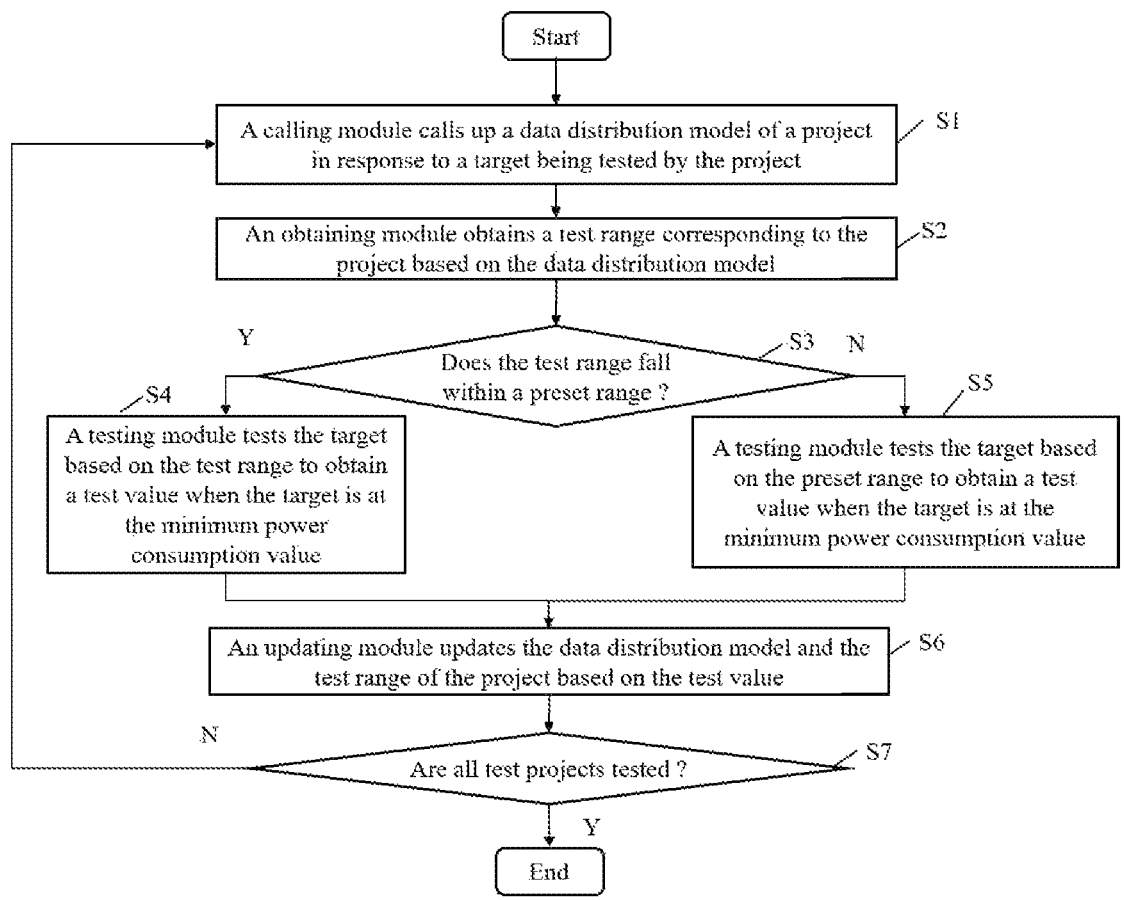
FIG. 3 illustrates a flowchart of one embodiment of a dynamic intelligent test method.

In at least one embodiment, the dynamic intelligent test system 10 may include one or more modules, the one or more modules are stored in the storage device 11, and are executed by at least one or more processors (e.g., the processor 12) to realize the dynamic intelligent test function (refer to FIG. 3).

Figure 2:
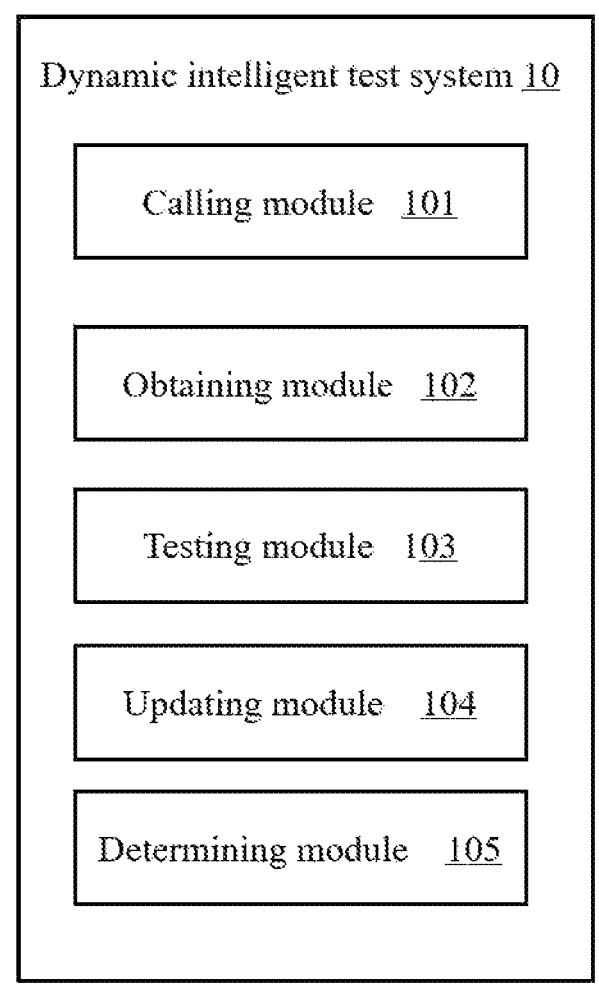
FIG. 2 is a block diagram of one embodiment of a dynamic intelligent test system.

In at least one embodiment, the dynamic intelligent test system 10 can be divided into multiple modules based on the functions it performs. Referring to FIG. 2, the multiple modules include a calling module 101, an obtaining module 102, a testing module 103, an updating module 104, and a determining module 105. The modules herein referred to are a series of computer-readable instruction segments that can be executed by at least one processor (such as the processor 12) and can perform fixed functions, and are stored in the storage device 11. In at least one embodiment, the functions of each module are shown in FIG. 3.

In at least one embodiment, the at least one processor 12 may execute various application programs (such as the dynamic intelligent test system 10), program codes, etc. installed in the computer device 1.

In at least one embodiment, the storage device 11 stores program codes of computer programs, and the at least one processor 12 can call the program codes stored in the storage device 11 to perform related functions. For example, each module of the dynamic intelligent test system 10 in FIG. 2 is a program code stored in the storage device 11, and executed by the at least one processor 12, so as to realize the function of each module to achieve the purpose of the dynamic intelligent test function (see FIG. 3).

In at least one embodiment, the storage device 11 stores one or more computer-readable instructions, which are executed by the at least one processor 12 to implement a dynamic intelligent test function purpose. Specifically, the specific implementation method of the at least one processor 12 for the above-mentioned computer-readable instructions is described in FIG. 3.

FIG. 3 illustrates a flowchart of a dynamic intelligent test method.

In at least one embodiment, the dynamic intelligent test method can be applied to the computer device 1. For the computer device 1 that needs to perform dynamic intelligent test, the function for dynamic intelligent test provided by the instant method can be directly integrated on the computer device 1, or can run on the computer device 1 in the form of a Software Development Kit (SDK).

Referring to FIG. 3, the method is provided by way of example, as there are a variety of ways to carry out the method. The method described below can be carried out using the configurations illustrated in FIG. 1, for example, and various elements of these figures are referenced in explaining method. Each block shown in FIG. 3 represents one or more processes, methods, or subroutines, carried out in the method. Furthermore, the illustrated order of blocks is illustrative only and the order of the blocks can be changed. Additional blocks can be added or fewer blocks can be utilized without departing from this disclosure. The example method can begin at block S1.

At block S1, the calling module 101 calls up a data distribution model of a project in response to a target being tested by the project.

In at least one embodiment, the target is a motherboard. When testing the motherboard by the project, for example, a minimum power consumption value of the motherboard at different frequencies is tested. A test software of the computer device 1 of a test station calls up the data distribution model of the project in a SDK on a server, for obtaining a test range corresponding to the project. It should be noted that the SDK includes several data distribution models for different projects.

In at least one embodiment, the project can include, but is not limited to, voltage, current, frequency, and radio frequency. In at least one embodiment, the data distribution model is generated based on test values of the project, and a distribution of all the test values is obtained by big data analysis of original test data. The original test data includes test data from both test-passed and test-failed of the project of the target. The data distribution model is established by inserting an artificial intelligence (AI) convolution deep learning module into the test data. A model prediction accuracy rate is obtained based on each verification result, and the computer device 1 determines whether the model prediction accuracy rate is less than a default threshold. If the model prediction accuracy rate is less than the default threshold, the computer device 1 uploads the data distribution model to the server. It should be noted that each project can generate its own data distribution model, and the computer device 1 can upload the data distribution model of each project to the server.

At block S2, the obtaining module 102 obtains a test range corresponding to the project based on the data distribution model.

In at least one embodiment, the test range is obtained by calling up the data distribution model to obtain a data distribution range corresponding to the project, and obtaining a data interval in which data with a preset probability falls and setting the data interval as the test range. For example, when testing voltage of the motherboard, the test software of the computer device 1 of the test station calls up the data distribution model of the project in the SDK on the server, and the computer device 1 can obtain a voltage distribution range through data analysis, and obtain the data interval in which data with a preset probability falls based on the voltage distribution range, and can set the data interval as the test range. For example, the computer device 1 can obtain the voltage distribution range 1.0V to 0.9V through data analysis through the data distribution model, and obtain the data interval 1.0V to 0.95V in which data with the preset probability 95% falls, and can set the data interval 1.0V to 0.95V as the test range. It should be noted that the preset probability can be set based on actual conditions, and a reasonable and desired range can be obtained by adjusting the preset probability.

In at least one embodiment, the computer device 1 further can set a confidence interval of the test range or the preset probability.

At block S3, the testing module 103 compares the test range with a preset range. When the test range falls within the preset range, the process goes to block S4; when the preset range falls within the test range, the process goes to block S5.

In at least one embodiment, the test software of the computer device 1 of the test station calls up the data distribution model of the project and defines the test range based on the data distribution model. For example, a preset voltage range is from 1.2V to 0.8V, and the test range obtained by the data distribution model is from 1.0V to 0.9V. Then, the test software will only test the voltage within the range of 1.0-0.9V.

In the prior art, when a data distribution model is not used, the test data is basically distributed between 1.1V and 0.85V. When performing voltage test on the target to be tested, the preset range is from 1.2V to 0.8V. By analyzing the data and obtaining 95% of the test data falling within the distribution range based on the data distribution model, the distribution range is from 1.0V to 0.9V. Then the test range can be defined as 1.0V to 0.9V, this is significantly smaller than the test range being used without the dynamic model.

At block S4, the testing module 103 tests the target based on the test range to obtain a test value when the target is at the minimum power consumption value.

In at least one embodiment, the testing module 103 can test the target by a preset test method based on the test range. The preset test method can include binary search algorithm, Fibonacci search algorithm, block search algorithm, hash search algorithm, binary tree search algorithm, and so on.

In at least one embodiment, the target is tested by the preset test method until the target obtains a minimum power consumption value. The minimum power consumption value is a critical value found when the target under test is prompted or alarmed due to undervoltage or insufficient energy.

For example, the testing module 103 tests the target based on the test range by using the Binary search algorithm. If the voltage test range is from 1.0V to 0.9V, the computer device 1 can test the motherboard starting from 0.95V and incrementing 0.05V each time (the interval is set by a user), and can test the motherboard starting from 0.95V and decrementing 0.05V. If the motherboard is normal when the voltage value is 1.0V, and the motherboard test is abnormal when the voltage value is 0.90V, the testing module 103 can determine that the critical value is between 0.95V and 0.90V, and continue to use the binary search algorithm to test the motherboard.

At block S5, the testing module 103 tests the target based on the preset range to obtain a test value when the target is at the minimum power consumption value.

In at least one embodiment, the method for testing the target based on the preset range is the same as the method for testing the target based on the test range, and details are not described herein again.

At block S6, the updating module 104 updates the data distribution model and the test range of the project based on the test value.

In at least one embodiment, the testing module 103 can test the target to be tested for obtaining the test value when the target is at the minimum power consumption value, and the updating module 104 can add the test value to the test data of a data service layer. The updating module 104 can update the data distribution model of the project, and re-analyze the data to obtain the data distribution range, and redefine the test range based on the data distribution range and the preset probability.

Gathering more and more test data will render the test results closer to the true threshold. The more concentrated the data distribution, the smaller the interval of the data distribution falling within the interval with the preset probability. Then, the smaller the range to be tested, and the faster the rate of testing. Based on gathering more actual test data, the data distribution model will be further dynamically updated. For example, the test value is only between 0.95V and 0.9V, and the data distribution model will also dynamically update the test range corresponding to the project voltage as being 0.95V~0.9V.

At block S7, the determining module 105 determines whether all test projects are tested. If all test projects are tested, the process ends, if some test projects remain to be tested, the process remains in block S1.

In at least one embodiment, when there are projects that have not completed the test, the data distribution model is called up to obtain a latest test range, and the target is tested based on the latest test range until the critical value is found. After testing the target using the latest test range, a verification result data is added to the original data for updating the data distribution model. Since the probability of finding good targets is much greater than the probability of finding bad targets, more and more test data brings the test value closer to a true value. When the test data is close to infinity, the test value is approximate to the true value, and the test range gets narrower and narrower. For example, the number of the original data items is 100, and there is a probability that 95% of the data is distributed between 1.0V and 0.9V. When the number of the test results in the data is 1000, assuming that the test value 0.96V has the maximum frequency this means that it is closer to the true value. The test value will approach closer and closer to 0.96V as the data becomes more concentrated. Then, the interval is closer to 0.96V when data falls within the interval with the 95% probability, for example, the data between 0.98V and 0.94V accounting for 95%. The computer device 1 compares the latest test range with the previous test range, if the latest test range has become smaller, the computer device 1 can update the test range of the data distribution model with the latest test range, and can call up the latest test range in the next test. The computer device 1 can use the binary search algorithm to test the target in the next test. For example, the latest test range is from 0.98V to 0.94V, the computer device 1 can test the motherboard starting from 0.96V and incrementing 0.02V each time, and can test the motherboard starting from 0.96V and decrementing 0.02V each time. That is, the range to be tested is getting smaller and smaller, and the rate of testing is getting faster and faster. When the data includes 10,000 test results, the test range will be smaller, the test rate will be faster, and so on, until an ideal test range is obtained.

It should be noted that, in one embodiment, the data distribution model corresponds to one project. For example, when the voltage of the motherboard needs to be tested, a first data distribution model can be called up to obtain the test range corresponding to the voltage; when the current of the motherboard needs to be tested, a second data distribution model can be called up to obtain the test range corresponding to the current. In other embodiment, the data distribution model corresponds to several projects. For example, when the voltage and the current of the motherboard needs to be tested, the computer device 1 can call up the data distribution model to obtain the test range corresponding to the voltage and the test range corresponding to electrical current.

In at least one embodiment, multiple data distribution models corresponding to different projects can be superimposed to obtain a data distribution model including multiple projects. For example, the project is voltage, and the test range of the voltage is from 0.95V to 0.9V. The project is current, and the test range of the current is from 50 mA to 10 mA. The project is frequency, and the test range of the frequency is from 1 MHz to 2 MHz. When the test data distribution model is uploaded to the server synchronously, the factory test software will synchronize the data distribution model to the test software of the station. It can be understood that after the superimposition of data distribution models of different projects, the data distribution model can be changed from two-dimensional to multi-dimensional, and the data distribution model of the minimum power consumption value of the motherboard under different test conditions can be obtained, and the minimum power consumption test range of the motherboard can be obtained under different test conditions. If at the beginning is the test data distribution model of the minimum power consumption value of the motherboard under different frequencies, the number of test cycles can be superimposed on the model, then the data distribution model becomes a test data distribution model with different frequencies and different test cycle times, for obtaining the minimum power consumption value of the motherboard. The dimensions of the model change from two-dimensional to three-dimensional, and so on, and the dimensions of the data distribution model can be increased by superimposing other test projects.

In at least one embodiment, the dynamic intelligent test method further includes determining whether a test frequency of the test data of a test interval is less than a predetermined frequency value by analyzing the test data of the test interval of the test range. If the test frequency of the test data of the test interval is less than the predetermined frequency value, the computer device 1 can determine that there is little or no test data of the test interval, and that a minimum power consumption value is not in the test interval. Then, the computer device 1 can skip the test interval except for testing the target, and continue to test the target in other test intervals until a minimum power consumption value is obtained, which can be combined with data analysis to simplify the test and further improve test efficiency. If the test frequency of the test data of the test interval is greater than or equal to the predetermined frequency value, the computer device 1 can test the target based on the test interval.

It should be emphasized that the above-described embodiments of the present disclosure, including any embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A computer device comprising:
a storage device; and
at least one processor, wherein
the storage device storing one or more programs that, when executed by the at least one processor, cause the at least one processor to:
call up a data distribution model of a project in response to a target being tested by the project;
obtain a test range corresponding to the project based on the data distribution model;
obtain a test value when the target is at a minimum power consumption value by testing the target based on the test range; and
update the data distribution model and the test range of the project based on the test value.

2. The computer device based on claim 1, wherein the project comprises voltage, current, frequency, and radio frequency.

3. The computer device based on claim 1, wherein the at least one processor is further caused to:
test the target by a preset test method based on the test range, wherein the preset test method comprises binary search algorithm, Fibonacci search algorithm, block search algorithm, hash search algorithm, and binary tree search algorithm.

4. The computer device based on claim 1, wherein the at least one processor is further caused to:
compare the test range with a preset range;
if the test range falls within the preset range, test the target based on the test range to obtain the test value when the target is at the minimum power consumption value;
if the preset range falls within the test range, test the target based on the preset range to obtain the test value when the target is at the minimum power consumption value.

5. The computer device based on claim 4, wherein the at least one processor is further caused to:
obtain a data distribution range corresponding to the project by calling up the data distribution model;
obtain a data interval in which data with a preset probability fall; and
set the data interval as the test range.

6. The computer device based on claim 1, wherein the at least one processor is further caused to:
determine whether a test frequency of test data of a test interval is less than a predetermined frequency value;
skip the test interval except for testing the target if the test frequency of the test data of the test interval is less than the predetermined frequency value; and
test the target based on the test interval if the test frequency of the test data of the test interval is greater than or equal to the predetermined frequency value.

7. A dynamic intelligent test method applicable in a computer device, the method comprising:
calling up a data distribution model of a project in response to a target being tested by the project;
obtaining a test range corresponding to the project based on the data distribution model;
obtaining a test value when the target is at a minimum power consumption value by testing the target based on the test range; and
updating the data distribution model and the test range of the project based on the test value.

8. The method based on claim 7, wherein the project comprises voltage, current, frequency, and radio frequency.

9. The method based on claim 7, the method further comprises:
testing the target by a preset test method based on the test range, wherein the preset test method comprises binary search algorithm, Fibonacci search algorithm, block search algorithm, hash search algorithm, and binary tree search algorithm.

10. The method based on claim 7, wherein the method further comprises:
comparing the test range with a preset range;
if the test range falls within the preset range, testing the target based on the test range to obtain the test value when the target is at the minimum power consumption value;
if the preset range falls within the test range, testing the target based on the preset range to obtain the test value when the target is at the minimum power consumption value.

11. The method based on claim 10, wherein the method further comprises:
obtaining a data distribution range corresponding to the project by calling the data distribution model;
obtaining a data interval in which data with a preset probability fall; and
setting the data interval as the test range.

12. The method based on claim 7, wherein the method further comprises:
determining whether a test frequency of test data of a test interval is less than a predetermined frequency value;

skipping the test interval except for testing the target if the test frequency of the test data of the test interval is less than the predetermined frequency value; and testing the target based on the test interval if the test frequency of the test data of the test interval is greater than or equal to the predetermined frequency value.

13. A non-transitory storage medium having stored thereon instructions that, when executed by at least one processor of a computer device, causes the at least one processor to perform a dynamic intelligent test method, the method comprising:

calling up a data distribution model of a project in response to a target being tested by the project;

obtaining a test range corresponding to the project based on the data distribution model;

obtaining a test value when the target is at a minimum power consumption value by testing the target based on the test range; and updating the data distribution model and the test range of the project based on the test value.

14. The non-transitory storage medium based on claim 13, wherein the project comprises voltage, current, frequency, and radio frequency.

15. The non-transitory storage medium based on claim 13, wherein the method further comprises:

testing the target by a preset test method based on the test range, wherein the preset test method comprises binary search algorithm, Fibonacci search algorithm, block search algorithm, hash search algorithm, and binary tree search algorithm.

16. The non-transitory storage medium based on claim 13, wherein the method further comprises:

comparing the test range with a preset range;

if the test range falls within the preset range, testing the target based on the test range to obtain the test value when the target is at the minimum power consumption value;

if the preset range falls within the test range, testing the target based on the preset range to obtain the test value when the target is at the minimum power consumption value.

17. The non-transitory storage medium based on claim 16, wherein the method further comprises:

obtaining a data distribution range corresponding to the project by calling the data distribution model;

obtaining a data interval in which data with a preset probability fall; and setting the data interval as the test range.

18. The non-transitory storage medium based on claim 13, wherein the method further comprises:

determining whether a test frequency of test data of a test interval is less than a predetermined frequency value;

skipping the test interval except for testing the target if the test frequency of the test data of the test interval is less than the predetermined frequency value; and testing the target based on the test interval if the test frequency of the test data of the test interval is greater than or equal to the predetermined frequency value.

* * * * *